United States Patent
Zoulkarneev et al.

(10) Patent No.: US 7,106,124 B2
(45) Date of Patent: Sep. 12, 2006

(54) FIELD EMISSION RF AMPLIFIER

(75) Inventors: Andrei Zoulkarneev, Suwon-si (KR); Jun-Hee Choi, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 30 days.

(21) Appl. No.: 11/049,903

(22) Filed: Feb. 4, 2005

(65) Prior Publication Data

US 2005/0184675 A1    Aug. 25, 2005

(30) Foreign Application Priority Data

Feb. 14, 2004    (KR) .......................... 10-2004-09839

(51) Int. Cl.
*H03K 17/92* (2006.01)
*H01J 17/00* (2006.01)

(52) U.S. Cl. ...................... 327/368; 327/370; 327/366; 313/588; 313/587

(58) Field of Classification Search ..................... None
See application file for complete search history.

(56) References Cited

U.S. PATENT DOCUMENTS 5,492,011 A * 2/1996 Amano et al. ........... 73/514.25

2004/0150311 A1* 8/2004 Jin .............................. 313/309
2005/0181587 A1* 8/2005 Duan et al. ................. 438/551

OTHER PUBLICATIONS

*Silicon Field Emitter Arrays with Low Capacitance and Improved Transconductance for Microwave Amplifier Applications*; J. Vac. Sci. Technol. B 13(2), Mar./Apr. 1995; pp. 576-579.

* cited by examiner

*Primary Examiner*—Tuyet Thi Vo
(74) *Attorney, Agent, or Firm*—Robert E. Bushnell, Esq.

(57) ABSTRACT

A field emission RF amplifier. The field emission RF amplifier includes one or more RF amplification units on a substrate and held in a vacuum state and facing a reflection electrode. The RF amplification unit includes a cathode electrode, gate electrode, and an anode electrode all formed on the same substrate. The cathode electrode has a CNT emitter. A DC voltages are applied to the cathode and anode electrodes. An RF signal is input at the cathode electrode and is amplified and output at the anode electrode. Capacitors and inductors are arranged to filter out AC and DC components where needed. An improved amplification of RF signals with high electron mobility and good impedance matching abilities result.

20 Claims, 6 Drawing Sheets

FIELD EMISSION RF AMPLIFIER

CLAIM OF PRIORITY

This application makes reference to, incorporates the same herein, and claims all benefits accruing under 35 U.S.C. §119 from an application for FIELD EMISSION RF AMPLIFIER earlier filed in the Korean Intellectual Property Office on 14 Feb. 2004 and there duly assigned Serial No. 2004-9839.

BACKGROUND OF THE INVENTION

1. Field of the Invention

The present invention relates to a field emission RF (Radio Frequency) amplifier, and more particularly, to a RF amplifier in which a field emission device carries out amplification.

2. Description of the Related Art

An RF amplifier receives a RF signal through an RF input terminal in the state that a predetermined DC bias voltage is supplied, and amplifies an amplitude of the RF signal to an RF output terminal. For such an RF amplification, the RF amplifier includes an RF amplification unit located between the RF input terminal and the RF output terminal.

A transistor can be the RF amplifier. However, since the transistor uses solid silicon, the transistor has poor electron mobility. Accordingly, a vacuum tube allowing electron transfer in a vacuum state can be substituted for the transistor, however, a problem exists that a conventional vacuum tube is too large in volume.

Studies for using a field emission device as the amplification unit in a vacuum panel are currently underway. An example of performing RF amplification using a silicon field emitter array is disclosed in "Silicon Field Emitter Arrays with Low Capacitance and Improved Transconductance for Microwave Amplifier Applications", by D. Palmer, et al., J.Vac.Sci, Techno.B 13(2), Mar/Apr 1995, pp. 576–579.

However, since the FEA (Field Emission Array) structure used for RF amplification uses a gate insulating layer with 4 μm thickness consisting of silicon oxide, it is difficult to match standard input/output resistance of 50Ω of an RF device due to the increase of capacitance between the gate and the cathode. Also, such an increase of capacitance reduces an output current, thus deteriorating an amplification effect of an RF signal.

SUMMARY OF THE INVENTION

It is therefore an object of the present invention to provide an improved field emission RF amplifier.

It is also an object of the present invention to provide an field emission RF amplifier with an improved amplification effect.

It is further an object of the present invention to provide a field emission RF amplifier that has improved impedance matching.

These and other objects can be achieved by a field emission RF amplifier that facilitates impedance matching with a different RF terminal by arranging a vacuum field emission device as a planar type, and improving an RF amplification effect. The RF amplifier includes an RF amplification unit on a substrate, the RF amplification unit includes a cathode electrode formed on the substrate, a gate electrode formed on the substrate at a side of the cathode electrode and separated from the cathode electrode by a predetermined distance, an anode electrode formed on the substrate at a side of the gate electrode opposite from that of the cathode electrode, an electron emission source located on the cathode electrode, the electron emission source emitting electrons by an electric field, a reflection electrode formed over the substrate and in parallel with the substrate, an RF signal input terminal and a DC cathode bias voltage being electrically connected to the cathode electrode and an RF output terminal and a DC anode bias voltage being electrically connected to the anode electrode.

A vacuum space is formed between the reflection electrode and the substrate with the cathode electrode, the gate electrode and the anode electrode formed therein. A negative voltage is applied to the reflection electrode so as to reflect electrons output from the electron emission source toward the anode electrode. The anode electrode, the gate electrode, and the cathode electrode are located on a same surface of the substrate. The electron emission source is CNT (carbon nanotube).

According to another aspect of the present invention, there is provided an RF amplifier which includes a plurality of RF amplification units on a substrate, each of the plurality of RF amplification units includes a cathode electrode formed on the substrate, a gate electrode formed on the substrate at a side of the cathode electrode and separated from the cathode electrode by a predetermined distance, an anode electrode formed on the substrate at a side of the gate electrode opposite from the cathode electrode, an electron emission source located on the cathode electrode, the electron emission source emitting electrons by an electric field, and a reflection electrode formed over the substrate and in parallel with the substrate, an RF input signal and a DC cathode bias voltage are electrically connected to the cathode electrode and a DC anode bias voltage electrically connected to the anode electrode and serving as an RF output signal. The RF amplification units are connected in serial to each other with a capacitor is located between the RF amplification units.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
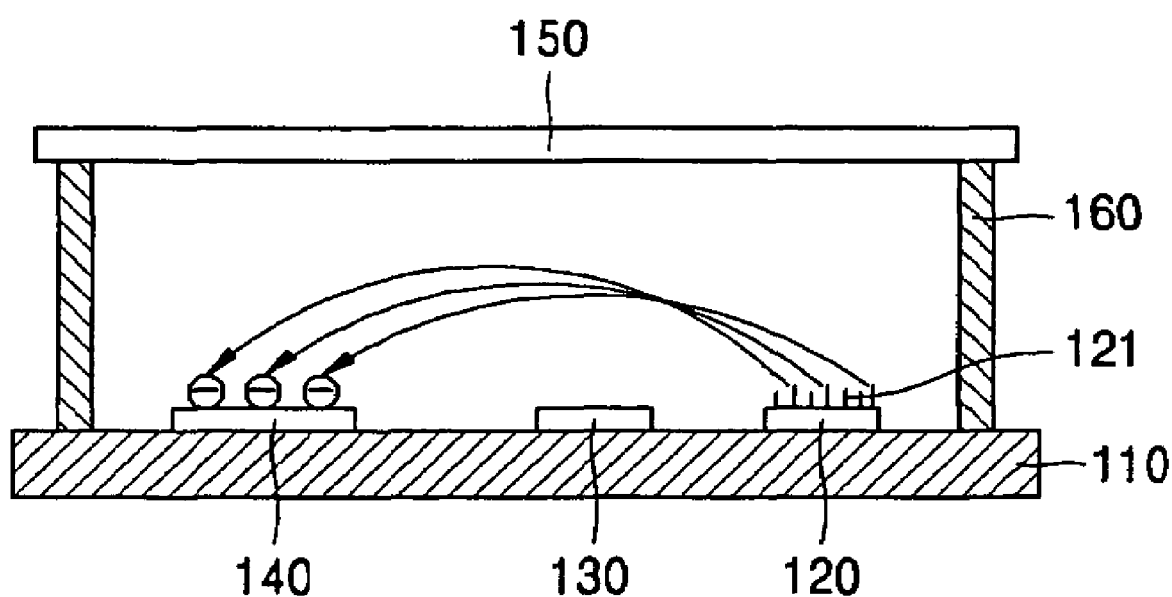
FIG. 1 is a sectional view illustrating a schematic structure of a RF amplification unit used in a field emission RF amplifier according to a preferred embodiment of the present invention.

Turning now to the figures, FIG. 1 is a sectional view illustrating a schematic structure of an RF amplification unit used in a field emission RF amplifier according to a preferred embodiment of the present invention. Referring to FIG. 1, an anode electrode 140, a gate electrode 130 and a cathode electrode 120 are separated and located by a predetermined distance on a substrate 110 in an RF amplifier. An electron emission source, for example, a CNT (carbon nanotube) emitter 121 is formed on the cathode electrode 120. A reflection electrode 150 is separated and located a predetermined distance from the substrate 110. Wall bodies 160 are formed between edges of the reflection electrode 150 and the substrate 110, so that a vacuum space is formed therein.

As a method for vacuum-sealing the vacuum space, a hot outgassing method for a conventional flat panel display can be utilized. Also, it is possible to form a vacuum space by putting a getter material for gas absorption, such as ST122, on the substrate 110 and/or the reflection electrode 150.

The substrate 110 can be made of an insulating material, for example, an alumina or a quartz. The anode electrode 140, the gate electrode 130 and the cathode electrode 120 may be formed with a thickness of 0.25 μm using conductive materials such as ITO (indium tin oxide) or Cr. A gap of 50 μm is formed between the gate electrode 130 and the cathode electrode 120. Each of the anode electrode 140, the gate electrode 130 and the cathode electrode 120 can be formed to have a width from 500 to 900 μm. This 500 to 900 micron width allows for impedance matching with an RF microstrip circuit.

The CNT emitter 121 can be formed by screen printing and baking. Alternatively, it is possible to form a CNT catalyst metal on the cathode electrode 120, then flow a carbon-containing gas to grow CNT on the CNT catalyst metal.

Figure 2:
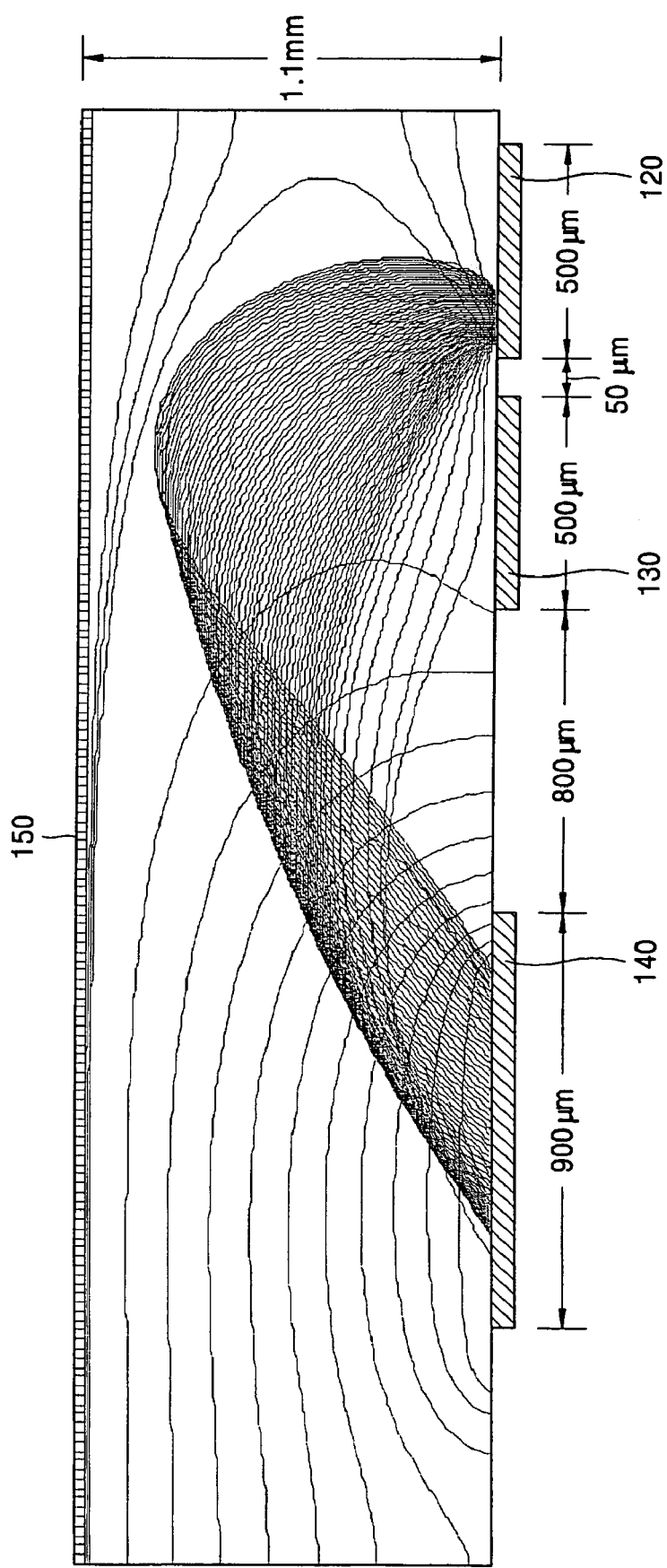
FIG. 2 is a simulation of an operation of the RF amplification unit of FIG. 1.

Turning now to FIG. 2, FIG. 2 is a simulation view illustrating an operation of the field emission RF amplifier of FIG. 1. Referring to FIGS. 1 and 2, the anode electrode 140, the gate electrode 130, and the cathode electrode 120 are located on the same plane and designed to each have a width of 900 μm, 500 μm and 500 μm respectively. A gap between the anode electrode 140 and the gate electrode 130 and a gap between the gate electrode 130 and the cathode electrode 120 are designed to be 800 μm and 50 μm, respectively. The lengths of the electrodes are designed to be 1 mm. The reflection electrode 150 is separated by 1.1 mm from lower electrodes 120, 130, and 140.

Also, DC voltages of 1.5 kV, −130 V and −140 V are applied respectively to the anode electrode 140, the cathode electrode 120 and the reflection electrode 150, and the gate electrode 130 is grounded. Preferably, a negative voltage greater than that applied to the cathode electrode 120 is applied to the reflection electrode 150. Electrons extracted from the cathode electrode 120 by the gate electrode 130 are curved toward the gate electrode 130 and change their directions by the negative voltage applied to the reflection electrode 150, causing the electrons to collide with the anode electrode 140 held at a strong voltage.

Figure 3:
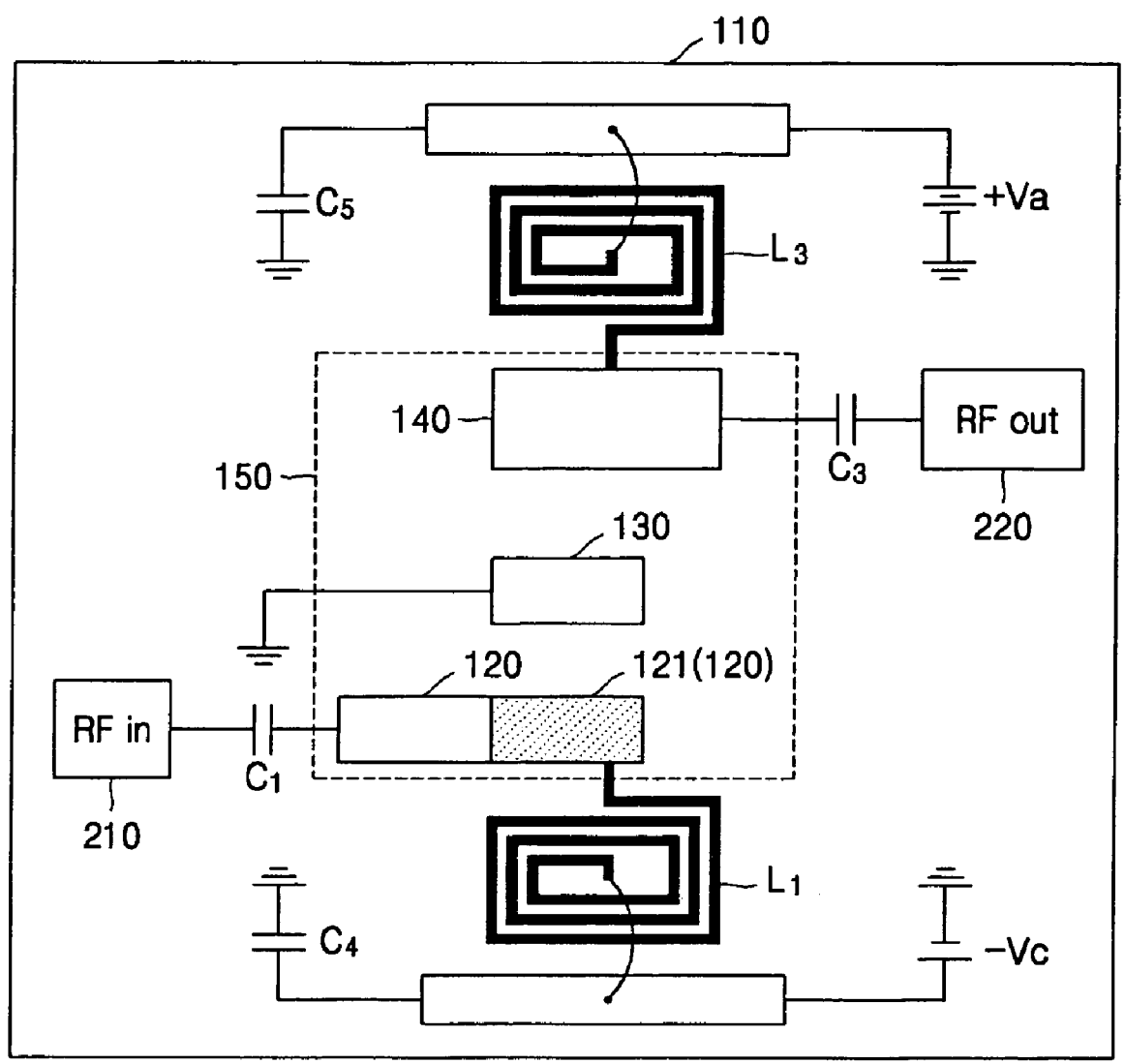
FIG. 3 is a schematic plan view of an RF amplifier according to an embodiment of the present invention.

Turning now to FIG. 3, FIG. 3 is a schematic plan of an RF amplifier according to an embodiment of the present invention. Substantially the same components as those in the embodiment are denoted by the same reference numbers throughout the drawings, and detailed descriptions therefor are omitted.

Referring to FIG. 3, the RF amplifier includes a RF amplification unit. The RF amplification unit consists of electrodes 120, 130 and 140 on a substrate 110, a reflection electrode 150 located above and over the electrodes 120, 130 and 130 in a manner to be opposite to the electrodes 120, 130 and 140, and wall bodies (160 of FIG. 1) formed between edges of the reflection electrode 150 and the substrate 110 and used to seal the space between the substrate 110 and the reflection electrode, allowing an inner space of the RF amplification unit to be maintained in a vacuum state.

An RF signal is received through an RF input terminal 210 and is input to one end of the cathode electrode 120. A capacitor C1 is used to filter out and prevent any DC voltage component from the RF input terminal 210 from reaching the cathode electrode 120. Also, an external DC bias cathode voltage −Vc is applied to the cathode electrode 120 via an inductor L1. The inductor L1 filters out and prevents any alternating component of the −Vc voltage source from reaching the cathode electrode 120. As illustrated in FIG. 3, the gate electrode 130 is electrically grounded.

A DC bias anode voltage +Va is applied to the anode electrode 140 via inductor L3. The inductor L3 filters out any alternating component from the +Va voltage source from reaching the anode electrode 140. An RF signal amplified by the anode electrode 140 is input to an RF output terminal 220 through a capacitor C3. The capacitor C3 prevents any DC voltage component from flowing to the RF output terminal 220 from the anode electrode 140. Meanwhile, capacitors C4 and C5 are blocking capacitors for preventing an RF signal transferred from the RF input terminal 210 from leaking out. The capacitors C4, C5 and inductors L1, L3 corresponding to the capacitors C4, C5 respectively form low-frequency filters.

Operations of the RF amplifier with the above-described structure will now be described. First, an RF signal is received through the RF input terminal 210 and is transferred to the cathode electrode 120 and mixed with a DC bias cathode voltage −Vc at the cathode electrode 120. Then, electrons are emitted from a CNT emitter 121 on the cathode electrode 120 by the gate electrode 130. The path of the emitted electrons is curved toward the gate electrode 130.

At this time, the electrons are reflected (or pushed away) from the reflection electrode 150 by a negative voltage applied to the reflection electrode 150, and the electrons then proceed to the anode electrode 140. At this time, a current variation width of the RF signal at the anode electrode 140 increases according to a voltage difference between the cathode voltage −Vc and a gate voltage (ground). That is, if the gate electrode 130 is grounded and a DC voltage of −120 through −140 V is applied to the cathode electrode 120, a current variation width ΔI of the RF signal at the anode electrode 140 increases by the electrons colliding at the anode electrode 140, so that the RF signal has a voltage variation width ΔV as a multiplication of the current variation width ΔI by impedance of the anode electrode 140 being a metal strip. That is, since the voltage variation width of the RF signal received through the RF input terminal 210 increases at the anode electrode 140, the RF signal is amplified.

The capacitor C1 removes any DC component of the RF signal received through the RF input terminal 210. Meanwhile, inductors L1 and L3 allow the DC bias voltage from the cathode bias voltage −Vc and the anode bias voltage +Va to pass through while blocking any alternating component. The capacitors C4 and C5 block the RF signal at the cathode electrode 120 and the anode electrode 140 respectively from leaking out through the inductors L1 and L3 respectively.

Figure 4:
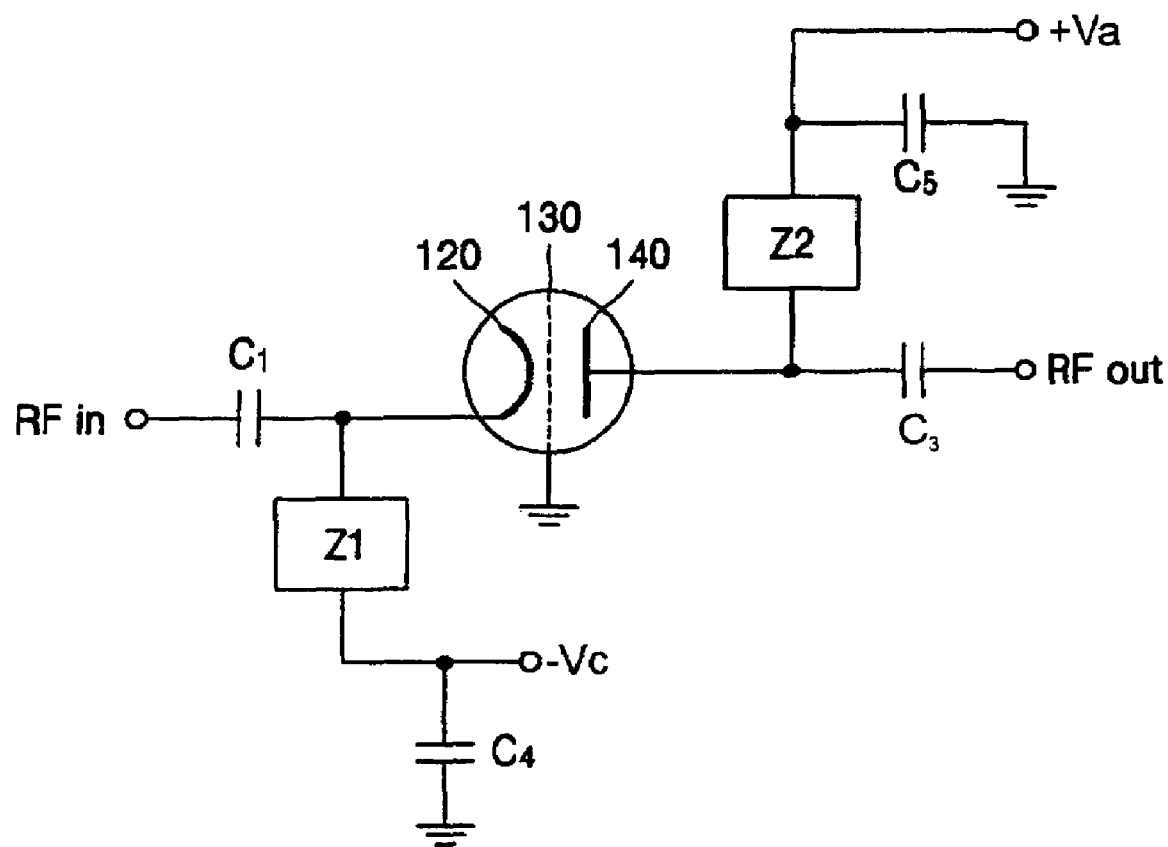
FIG. 4 is an equivalent circuit diagram of FIG. 3.

Turning now to FIG. 4, FIG. 4 is an equivalent circuit diagram of FIG. 3. Referring to FIG. 4, reference numerals Z1 and Z2 indicate impedances created by capacitance and inductance of capacitor and inductor located at transmission paths of bias DC voltage connected to the corresponding electrode, respectively. The impedance can be created to approach standard impedance required for impedance matching of the RF circuit due to the reduction of capacitance.

Figure 5:
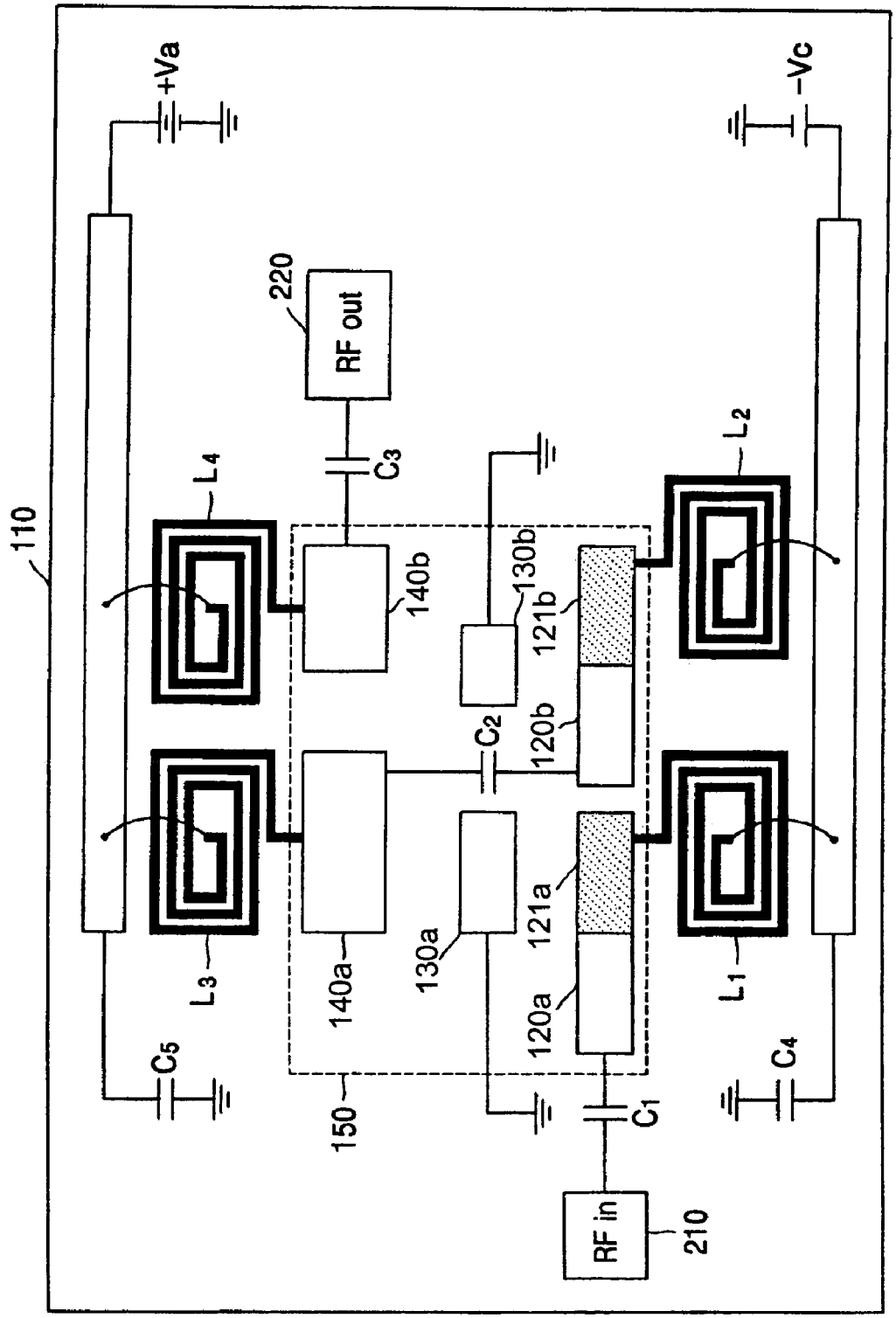
FIG. 5 is a schematic plan view of an RF amplifier according to another embodiment of the present invention.

FIG. 5 is a schematic plan view of an RF amplifier according to another embodiment of the present invention. The substantially same components as those in the embodiment are denoted by the same reference numbers throughout the drawings, and detailed descriptions therefor are omitted.

Referring to FIG. 5, the RF amplifier includes two RF amplification units (first RF amplification unit and second RF amplification unit). The first amplification unit has a cathode electrode 120a, a gate electrode 130a and an anode electrode 140a. The second amplification unit also has a cathode 120b, a gate electrode 130b and an anode electrode 140b. These six electrodes are on a substrate 110 with a reflection electrode 150 separated from substrate 110 by wall bodies (160 of FIG. 1) for sealing which are formed between edges of the reflection electrode 150 and the substrate 110. The inner space of each RF amplification unit is maintained in a vacuum state.

A capacitor C2 is placed between the two RF amplification units to filter out any DC bias voltage from the RF signal output from the first RF amplification unit, passing only the alternating component to the second RF amplification unit.

An RF signal received through the RF input terminal 210 is input to the cathode electrode 120a of the first amplification unit. The amplified RF signal from the first RF amplification unit is input to the cathode electrode 120b of the second amplification unit. A capacitor C1 is used to filter out any DC component from the received signal at the RF input terminal 210 before the signal is sent to the cathode terminal 120a of the first amplification unit. The capacitor C2 filters out any DC bias from the anode electrode 140a of the first amplification unit before it reaches the cathode electrode 120b of the second amplification unit. Also, an external DC bias cathode voltage –Vc is applied to each cathode electrode 120a, 120b through inductors L1 and L2 respectively. The inductors L1 and L2 filter out any alternating component from the cathode voltage source –Vc before it reaches a cathode electrode.

As can be seen in FIG. 5, each gate electrode 130a and 130b is grounded. Also, a DC bias anode voltage Va is applied to each the anode electrode 140 through inductors L3 and L4. The inductors L3 and L4 prevent an alternating component from being input to the anode electrode 140. An RF signal passing through the second RF amplification unit and amplified at the anode electrode 140b is input to an RF output terminal 220 via a capacitor C3. The capacitor C3 prevents a DC bias voltage from flowing out to the RF output terminal.

Meanwhile, capacitors C4 and C5 are blocking capacitors that prevent the RF signal received through the RF input terminal 210 or the RF signal input to the second amplification unit from leaking out. The capacitors C4, C5 and corresponding inductors L1, L2, L3, and L4 form low-frequency filters.

The operation of the RF amplifier with the above-described structure will now be described. First, an RF signal received from the RF input terminal 210 is transferred to the cathode electrode 120a and mixed with a DC bias cathode voltage –Vc at the cathode electrode 120a. Successively, electrons are emitted from a CNT emitter 121a on the cathode electrode 120a by the gate electrode 130a and the emitted electrons are curved toward the gate electrode 130a. At this time, the electrons are reflected from the reflection electrode 150 by a negative voltage applied to the reflection electrode 150, and proceed to the anode electrode 140a. At this time, a current variation width of the RF signal in the anode electrode 140a increases according to a voltage difference between the cathode voltage –Vc and a gate voltage. That is, if the gate voltage 130a is grounded and a DC voltage of –120 through –140 V is applied to the cathode electrode 120a, a current variation width ΔI of the RF signal in the anode electrode 140a increases by electrons colliding at the anode electrode 140a, so that the RF signal has a voltage variation width ΔV as a multiplication of the current variation width ΔI by impedance of the anode electrode 140a being a metal strip. That is, since the voltage variation width of the RF signal received through the RF input terminal 210 increases at the anode electrode 140a, the RF signal is amplified.

Successively, the amplified RF signal at the anode electrode 140a passes the capacitor C2 so that any DC component is blocked. Accordingly, a first amplified RF signal is input to the cathode electrode 120b of the second RF amplification unit. The RF signal input to the second RF amplification unit is amplified by the second RF amplification unit in the above-described manner and input to the capacitor C3. Therefore, the RF signal whose DC component is removed after passing through the capacitor C3 is output to the RF output terminal 220.

The capacitor C1 removes a DC component of the RF signal received from the RF input terminal 210. Meanwhile, inductors L1 through L4 pass a DC bias voltage of the cathode bias voltage –Vc or the anode bias voltage +Va and block any alternating component. Capacitors C4 and C5 block an RF signal at the cathode electrode 120 and the anode electrode 140 from leaking out through the inductors.

Figure 6:
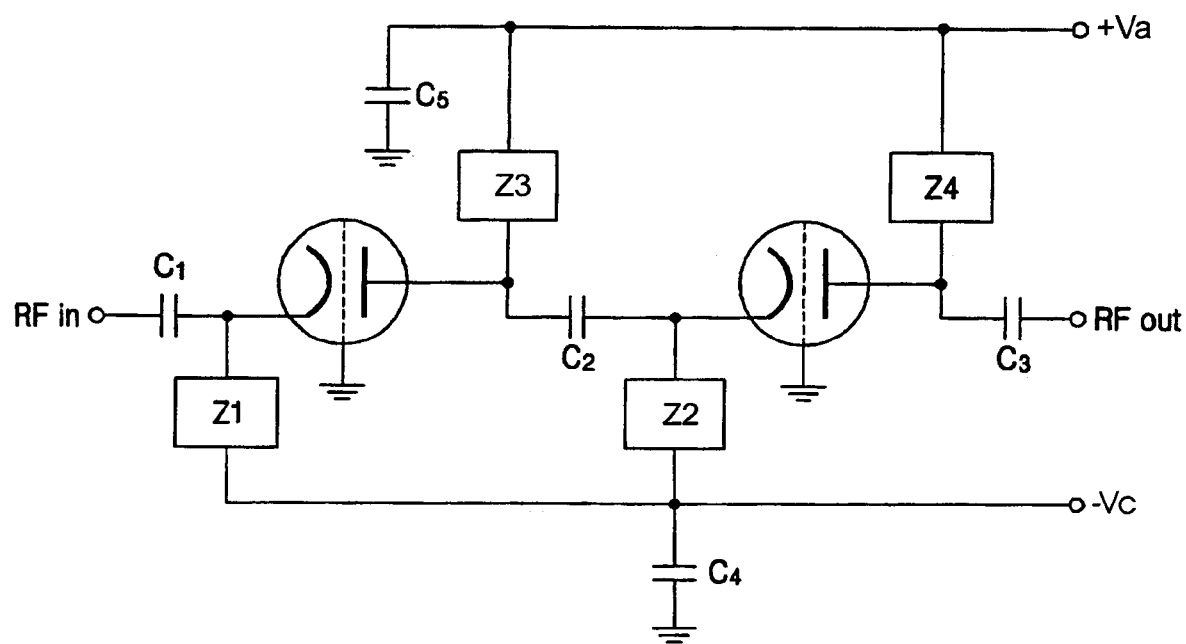
FIG. 6 is an equivalent circuit diagram of FIG. 5.

Turning now to FIG. 6, FIG. 6 is an equivalent circuit diagram of FIG. 5. Referring to FIG. 6, reference numbers Z1 through Z4 indicate impedances formed by capacitances and inductances of capacitors and inductors located at transmission paths of bias DC voltages connected to the corresponding electrode, respectively. The impedance can be made to approach standard impedance required for impedance matching of the RF circuit due to the reduction of capacitance.

In the above embodiment, an RF amplifier including two RF amplification units has been described, however, the present invention is not limited thereto. That is, an RF amplifier including three or more RF amplification units can be implemented.

As described above, since a field emission RF amplifier according to the present invention is a planar type field emission device in a vacuum state as an RF amplification unit, it is possible to increase electron mobility in the amplification unit and improve an amplification effect. Also, by arranging electrodes forming a field emission device on a plane, it is possible to reduce capacitance between a gate electrode and a cathode electrode and accordingly easily create standard impedance.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. An RF amplifier, comprising:
an RF amplification unit arranged on a substrate, the RF amplification unit comprising:
a gate electrode arranged on the substrate;

a cathode electrode arranged on the substrate and separated from the gate electrode by a predetermined distance;

an anode electrode arranged on the substrate, the gate electrode being arranged between the anode electrode and the cathode electrode;

an electron emission source arranged on the cathode electrode, the electron emission source adapted to emit electrons by an electric field;

a reflection electrode arranged over the substrate and in parallel with the substrate;

an RF signal input terminal electrically connected to the cathode electrode;

an RF signal output terminal electrically connected to the anode electrode;

a DC cathode bias voltage electrically connected to the cathode electrode; and a DC anode bias voltage electrically connected to the anode electrode.

2. The RF amplifier of claim 1, a space between the reflection electrode and the substrate being evacuated, the cathode electrode, the gate electrode and the anode electrode being within said evacuated space.

3. The RF amplifier of claim 1, wherein a negative voltage is applied to the reflection electrode causing electrons output from the electron emission source to reflect toward the anode electrode.

4. The RF amplifier of claim 1, wherein the anode electrode, the gate electrode, and the cathode electrode are all arranged on a same surface of the substrate.

5. The RF amplifier of claim 1, wherein the electron emission source is CNT.

6. The RF amplifier of claim 1, the cathode electrode is arranged in a direction from the gate electrode that is diametrically opposite a direction the anode is arranged from the gate electrode.

7. The RF amplifier of claim 1, the cathode electrode being separated from the gate electrode by 50 microns.

8. The RF amplifier of claim 1, anode electrode being separated from the gate electrode by 800 microns.

9. The RF amplifier of claim 1, each of the cathode electrode and the gate electrode being 0.5 to 0.8 mm wide and 1.0 mm long.

10. The RF amplifier of claim 1, the reflection electrode being separated from the substrate by 1.1 mm.

11. An RF amplifier, comprising a plurality of RF amplification units arranged on a substrate, each of the plurality of RF amplification units comprises:

a gate electrode arranged on the substrate;

a cathode electrode arranged on the substrate and separated from the gate electrode by a predetermined distance;

an anode electrode arranged on the substrate and in a direction from the gate electrode opposite from a direction that the cathode electrode is arranged;

an electron emission source arranged on the cathode electrode, the electron emission source adapted to emit electrons by an electric field; and a reflection electrode arranged over the substrate and in parallel with the substrate, an RF input signal and a DC cathode bias voltage being electrically applied to the cathode electrode and a DC anode bias voltage being applied to the anode electrode, an amplified signal being present at the anode electrode.

12. The RF amplifier of claim 11, a space between the reflection electrode and the substrate being a vacuum, the cathode electrode, the gate electrode and the anode electrode of each RF amplification unit being within said vacuum space.

13. The RF amplifier of claim 11, wherein a negative voltage is applied to the reflection electrode causing electrons output from the electron emission source to reflect toward the anode electrode.

14. The RF amplifier of claim 11, wherein the anode electrodes, the gate electrodes, and the cathode electrodes of each RF amplification unit are arranged on a same surface of the substrate.

15. The RF amplifier of claim 11, wherein the electron emission source is CNT.

16. The RF amplifier of claim 11, wherein each of the RF amplification units are connected serially.

17. The RF amplifier of claim 16, further comprising a capacitor arranged between each RF amplification unit, one end of the capacitor being connected to an anode electrode of a preceding RF amplification unit and another end of the capacitor being connected to a cathode electrode of a subsequent RF amplification unit.

18. An RF amplifier, comprising:

a plurality of RF amplification units that comprise:

a substrate; and a reflection electrode arranged parallel to the substrate with a space there between, the space there between being a vacuum, the substrate having a first surface facing the reflection electrode and a second surface facing away from the reflection electrode, the first surface being exposed to the vacuum, each of the plurality of RF amplification units further comprises:

a gate electrode, a cathode electrode and an anode electrode, each being arranged on the first surface of the substrate, the gate electrode being arranged between the cathode electrode and the anode electrode;

an electron emission source arranged on the cathode electrode, the electron emission source adapted to emit electrons by an electric field;

an RF signal input terminal electrically connected to the cathode electrode;

a DC cathode bias voltage electrically connected to the cathode electrode; and a DC anode bias voltage electrically connected to the anode electrode.

19. The RF amplifier of claim 18, further comprising a capacitor arranged between each of said plurality of RF amplification units, the capacitor connecting an anode of one RF amplification unit to a cathode of another RF amplification unit.

20. The RF amplifier of claim 18, a gate electrode of each amplification unit being separated from a cathode electrode in same amplification unit by 50 microns, each of the gate electrode and the cathode electrode being between 0.5 and 0.8 mm wide.

* * * * *